US009162518B2

(12) United States Patent
Demierre et al.

(10) Patent No.: US 9,162,518 B2
(45) Date of Patent: Oct. 20, 2015

(54) METHOD FOR PRODUCING MICROPARTICLES

(75) Inventors: Nicolas Demierre, Corseaux (CH); Stephan Gamper, Lausanne (CH)

(73) Assignee: MYCARTIS NV, Zwijnaarde/Ghent (BE)

( * ) Notice: Subject to any disclaimer, the term of this patent is extended or adjusted under 35 U.S.C. 154(b) by 480 days.

(21) Appl. No.: 13/446,499

(22) Filed: Apr. 13, 2012

(65) Prior Publication Data

US 2013/0095574 A1     Apr. 18, 2013

Related U.S. Application Data

(63) Continuation of application No. PCT/CH2010/000257, filed on Oct. 14, 2010.

(30) Foreign Application Priority Data

Oct. 14, 2009    (EP) ..................................... 09012970

(51) Int. Cl.
     *B44C 1/22*        (2006.01)
     *H01L 21/027*    (2006.01)
     (Continued)

(52) U.S. Cl.
     CPC ............... *B44C 1/227* (2013.01); *B81C 99/008* (2013.01); *G03F 7/00* (2013.01); *H01L 21/0272* (2013.01); *B01J 2219/00497* (2013.01); *B01J 2219/00502* (2013.01); *B01J 2219/00536* (2013.01); *B01J 2219/00554* (2013.01); *B01J 2219/00556* (2013.01); *B01J 2219/00576* (2013.01); *B01J 2219/00612* (2013.01);
     (Continued)

(58) Field of Classification Search
     CPC ...... B44C 1/227; B44C 1/22; H01L 21/0272; H01L 21/027; H01L 21/0274; H01L 21/0331
     USPC ................. 438/745, 748, 753, 754, 784, 780; 216/40, 41, 67, 79
     See application file for complete search history.

(56) References Cited

U.S. PATENT DOCUMENTS

| 6,423,563 | B2 * | 7/2002 | Fukada et al. | ................... 438/50 |
| 6,755,982 | B2 * | 6/2004 | Lin | .................................... 216/2 |
| 7,745,092 | B2 | 6/2010 | True | .......................... 430/270.1 |

(Continued)

FOREIGN PATENT DOCUMENTS

| EP | 0 863 797 | 9/1998 | ............... B01J 19/00 |
| EP | 1 018 365 A2 | 12/2000 | |

(Continued)

OTHER PUBLICATIONS

International Search Report dated Jan. 7, 2011 from PCT/CH2010/000257.

(Continued)

*Primary Examiner* — Lan Vinh
(74) *Attorney, Agent, or Firm* — Kusner & Jaffe (57) ABSTRACT

Silicon microcarriers suitable for fluorescent assays as a well as a method of producing such microcarriers are provided. The method includes the steps of providing a SOI wafer having a bottom layer of monocristalline silicone, an insulator layer and a bottom layer of monocristalline silicon, delineating microparticles, etching away the insulator layer and then depositing an oxide layer on the wafer still holding the microparticles before finally lifting-off the microparticles.

15 Claims, 10 Drawing Sheets

(51) Int. Cl.
  *B81C 99/00* (2010.01)
  *G03F 7/00* (2006.01)

(52) U.S. Cl.
  CPC ............... *B01J 2219/00635* (2013.01); *B01J 2219/00637* (2013.01); *B01J 2219/00722* (2013.01)

(56) References Cited

U.S. PATENT DOCUMENTS

| | | | | |
|---|---|---|---|---|
| 7,910,934 | B2 * | 3/2011 | Kim et al. | 257/82 |
| 2003/0203390 | A1 * | 10/2003 | Kaye et al. | 435/6 |
| 2006/0278942 | A1 * | 12/2006 | Rubel | 257/415 |
| 2009/0008366 | A1 * | 1/2009 | Hara | 216/109 |
| 2009/0149340 | A1 * | 6/2009 | True | 506/9 |

FOREIGN PATENT DOCUMENTS

| | | | |
|---|---|---|---|
| EP | 1 276 555 | 1/2003 | ............ B01J 19/00 |
| EP | 2 113 301 A1 | 11/2009 | |
| GB | 2 306 484 | 5/1997 | ............ G06K 19/06 |
| GB | 2 306 484 A | 5/1997 | |
| GB | 2 334 347 A | 8/1999 | |
| GB | 2 422 686 A | 8/2006 | |
| WO | 01/78889 A2 | 10/2001 | |
| WO | 02/29136 A1 | 4/2002 | |
| WO | WO 02/29136 | 4/2002 | ............ C25D 5/02 |
| WO | 2007-081410 A2 | 7/2007 | |
| WO | 2009/014848 A2 | 1/2009 | |

OTHER PUBLICATIONS

Bras et al., "Optimisation of a silicon/silicon dioxide substrate for a fluorescence DNA microarray," Biosensors and Bioelectronics, 2004, pp. 797-806.
Volle et al., "Enhanced sensitivity detection of protein immobilization by fluorescent interference on oxidized silicon," Biosensors and Bioelectronics, 2003, pp. 457-464).
Graf et al., "A General Method to Coat Colloidal Particles with Silica," Langmuir, 2003, pp. 6693-6700).
Bhardwaj et al., "Advanced silicon etching using high density plasmas," SPIE vol. 2639, 224 (1995).
Schilp et al., "Advanced Etch Tool for High Etch Rate Deep Reactive Ion Etching in Silicon Micromachining Production Environment," Proceeding MST 2001.
Madou, 2002, "Deep Reactive Ion Etching (DRIE)," Fundamentals of Microfabrication, CRC Press, pp. 105-106.
Wikipedia, "Deep reactive-ion etching," http://en.wikipedia.org/wiki/Deep_reactive-ion_etching first accessed on Oct. 9, 2009.
Eine neue Reihe organischer Diamine. H. Schiff Justus Liebigs Ann Chemie 140, 92-13 7 1866 (including Concise Explanation of Relevance of Non-English Language Document).
Kaiser et al., "Color Test for Detection of Free Terminal Amino Groups in the Solid-Phase Synthesis of Peptides," Short Communicatins, Analytical Biochemistry 34 595 (1970), pp. 595-598.

* cited by examiner

METHOD FOR PRODUCING MICROPARTICLES

CROSS REFERENCE TO RELATED APPLICATIONS

This application is a continuation of International Application No. PCT/CH2010/000257 filed Oct. 14, 2010, which claims the benefit of European Application No. 09012970.1, filed Oct. 14, 2009, the entire contents of both of which are incorporated herein by reference.

BACKGROUND OF THE INVENTION

1. Field of the Invention

The present application relates to microparticles, in particular silicon microparticles, and a method for coating these.

2. Description of Related Art

Several publications (for example European Patent EP 1276555B1) describe the fabrication of microparticles, notably silicon microparticles, using wafer based microfabrication techniques. Biological probes, such as antibodies or nucleic acids, can then be attached to those microparticles using techniques known in the art and the microparticles can then subsequently be used for the detection of target analytes in a sample.

However, when attaching fluorescent probes (typically ssDNA probes labelled with FAM fluorophore at the 5' end) on the surface of silicon microparticles and performing subsequently hybridization assays with complementary targets labelled with Cy5 fluorophore did not reveal any fluorescence signal neither on the FAM channel before hybridization or on the Cy5 channel after hybridization.

After investigation, this appeared to be caused by destructive light interference occurring right at the surface of the partially reflective silicon microparticles. This phenomenon is described in several scientific publications (Bras, M., et al., *Optimisation of a silicon/silicon dioxide substrate for a fluorescence DNA microarray*. Biosensors & bioelectronics, 2004. 20(4): p. 797-806; Voile, J. N., et al., *Enhanced sensitivity detection of protein immobilization by fluorescent interference on oxidized silicon*. Biosensors and Bioelectronics, 2003. 19(5): p. 457-464). The same phenomenon would be observed to some extent on any material that is reflective.

The scientific publications mentioned above suggest the addition of an oxide layer at optimized thickness to move the fluorophores away from the surface and reverse this effect into a constructive light interference which reveals and potentially amplifies the fluorescence signal. A similar method, i.e. the addition of a transparent layer (silicon dioxide, silicon nitride, or others) with the proper thickness, could be applied to other materials than silicon as a substrate.

The reflection coefficient of a polished silicon wafer (or SOI (silicon-on-insulator) wafer) is about 35-40% in the 500-700 nm wavelength range. This means that significant light interference occurs in this range, which includes the common fluorescent labels such as FAM, Cy3, and Cy5. The interference effect is dependent on the thickness of the layer (oxide in this case) that separates the fluorescent labels from the reflective surface of the silicon. In particular cases the interference can completely anneal the fluorescent signal while it can strongly enhance the signal in other cases. The interference can be either destructive or constructive, as function of the thickness of the layer, of the refractive index of the layer, of the wavelength of the light, and of its angle of incidence. For instance, at quasi normal incidence, constructive light interference of a light beam reflected specularly by a substrate is maximal at the position of the electromagnetic field "antinodes" which are located periodically at distances $d_{an}=(2k+1)\lambda_{eff}/4$ from the substrate; k is a positive integer and $\lambda_{eff}$ is the wavelength of light in the propagation medium. Thus, for $k=0$, $d_{an}=\lambda_{eff}=\lambda_{cy5}/n_{oxide}/4=654/1.45/4=113$ nm for the common Cy5 fluorescent label, where $\lambda_{cy5}$ is the mean value between the absorbance peak and the emission peak and where $n_{oxide}$ is the refractive index of silicon dioxide. Thus, in order to achieve maximal constructive light interference, the layer needs to have a thickness of ca. 113 nm. The same reasoning applies to any other fluorescent label.

The scientific publications referenced above describe methods to add an oxide layer on top of the silicon substrates. However, those methods are only applicable to large substrates that can be handled easily and that are already in their final format. For small microparticles in the micron range, typically from 1 to 300 micron, such as those that are contemplated herein, these methods are not readily applicable. Typically, such small microparticles are handled "in batch" as a powder, in suspension or temporarily tethered to larger substrates and the methods disclosed in the art do not teach how to perform the required steps in such conditions.

The fabrication of microparticles by using wafer-based microfabrication techniques is well known in the art. These techniques typically make use of particular wafers (SOI wafers) that have an insulator layer. The microparticles can be structured in the top device layer and then released by etching away the buried insulator layer. For example, WO 2009/014848, WO 07/081410, GB2306484, US2003/203390, EP 1 018 365 and EP 2 113 301 describe the fabrication of various types of (generally encoded) microparticles with various shapes and structures.

However, there is a need in the art for fabrication techniques providing for the addition of an essentially transparent layer that would contribute to the construction of a positive interference as described above. The problem of adding a transparent layer is particularly challenging when the material constituting this transparent layer is the same as the material used as the insulator layer (buried insulator layer in SOI wafer) because such additional layer would be partially or totally removed when etching away the insulator, typically in solution or in vapor of HF (hydrofluoric acid solution).

A possible way to overcome this problem and to perform the coating of those microparticles could be the use of conventional suspension techniques. Yet, there is no known method that would allow achieving a coating with a layer that has the required thickness and the required regularity/repeatability. Indeed, an irregular or a different thickness at each batch would result in irregular or different fluorescent signals readouts at each time, for the same amount of attached fluorophores (i.e. the same amount of labeled targets being captured), which renders quantization difficult or impossible. For example, a thin oxide layer of a few nanometers, typically 3 nm, as obtained when oxidizing the microparticles in piranha solution (mixture of sulfuric acid $H_2SO_4$ and hydrogen peroxide $H_2O_2$ in typical ratio of 3:1), would prevent any fluorescence readout perpendicular to the microparticles by producing destructive light interference. Another example is the formation of a thin silica (silicon dioxide) shell around the microparticles using a sol-gel method similar to silica coating of nanoparticles (Graf C, Vossen D U, Imhof A, van Blaaderen A. *A General Method To Coat Colloidal Particles with Silica*. Langmuir. 2003; 19(17):6693-6700) but does not provide a controlled and homogeneous layer and does not achieve required thickness of approx. 100 nm. The sol-gel process, also known as chemical solution deposition, is a wet-chemical technique widely used in the fields of materials science used primarily for the fabrication of materials (typically an oxide) starting from a chemical solution (or sol) that acts as the precursor for an integrated network (or gel) of either discrete particles or network polymers.

Polymer layers instead of an oxide layer may also be considered but, here again, it becomes difficult to get layers with the required thickness (above 100 nm) and homogeneity.

There is therefore a need in the art for a method that allows the production of microparticles with a layer, preferably a transparent layer, more preferably an oxide layer, on their surface having the required thickness and regularity/repeatability.

SUMMARY OF THE INVENTION

The invention presents a novel wafer-based microfabrication process for producing planar microparticles that are suitable for optical readout of fluorescence signal present on the surface of the microparticles. The microfabrication of the microparticles is based on standard processes routinely run in cleanroom facilities such as silicon or MEMS (micro-electro-mechanical-systems) foundries. The processes are combined to an innovative method for the production of microparticles with a thin film layer deposited on one surface and their circumference and takes advantage of an unexpected behavior during an etching process step.

Thus, in a first aspect, the invention provides a method for producing microcarriers suitable for fluorescent assays, comprising the steps of (a) Providing a wafer having a sandwich structure comprising a bottom layer, an insulator layer and a top layer; (b) Etching the top layer to delineate microparticles; (c) Etching away the insulator layer (pre-release of the microparticles); (d) Depositing a thin film layer on the wafer still holding the microparticles; and (e) Lifting-off the microparticles from the wafer.

In another aspect, the invention provides a silicon microparticle obtainable by the method disclosed herein.

In still another aspect, the invention provides a silicon microparticle and/or a silicon microcarrier having a wafer-like shape and being coated by a layer of a dielectric material on one surface and on its circumference.

The microparticles, typically having a dimension comprised between 0.1 and 300 micrometers and which can be encoded, may e.g. be used in diagnostic applications, preferably in multiplexed assays.

When performing a fluorescence based assay and exposing such microparticles and/or microcarriers to fluorescent imaging, the surface and circumference being covered with the additional layer will give a fluorescence signal, whereas no fluorescence signal will be observable on the surface not being covered with the layer, by using conventional fluorescence microscopy.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

Figure 1:
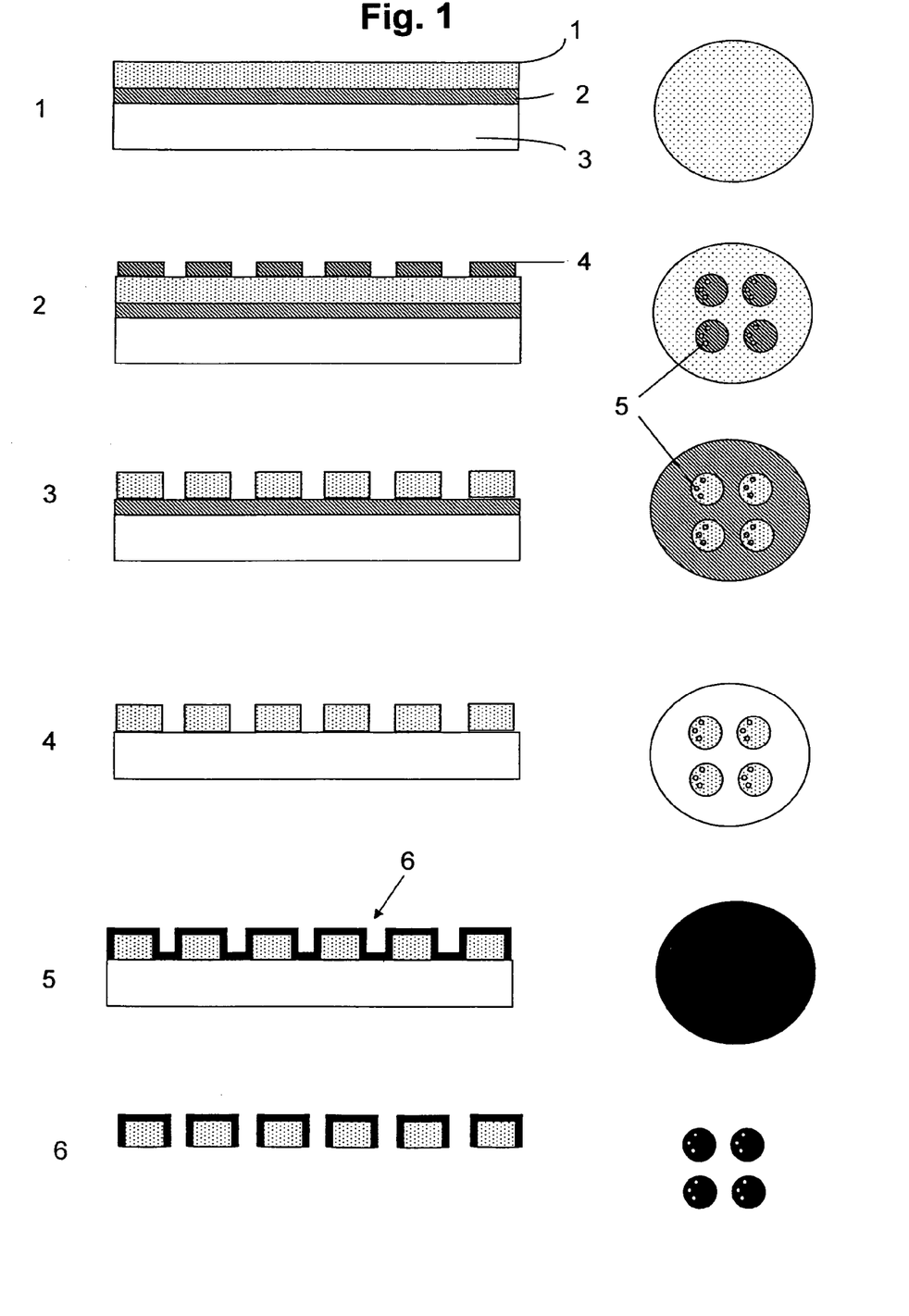
FIG. 1 depicts an exemplary 6-steps microfabrication process flow according to the instant invention.

FIG. 1 depicts an exemplary 6-steps microfabrication process flow according to the instant invention. The left row shows a cross-sectional view, whereas the right row shows a top view of a microparticle during the six different steps of the fabrication process described herein, bottom layer 3; buried layer (or insulator layer) 2, top layer 1, photosensitive resist layer 4, hole traversing the microparticle as part of a code 5, thin film layer 6.

Figure 2:
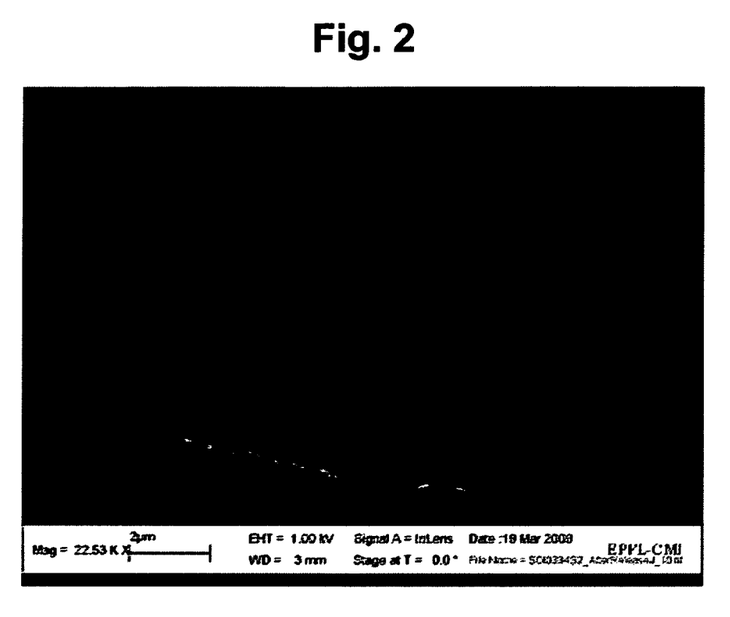
FIG. 2 shows a SEM characterization of the microcarrier surface after oxide deposition by PECVD.

FIG. 2 shows a SEM characterization of the microcarrier surface after oxide deposition by PECVD.

Figure 3:
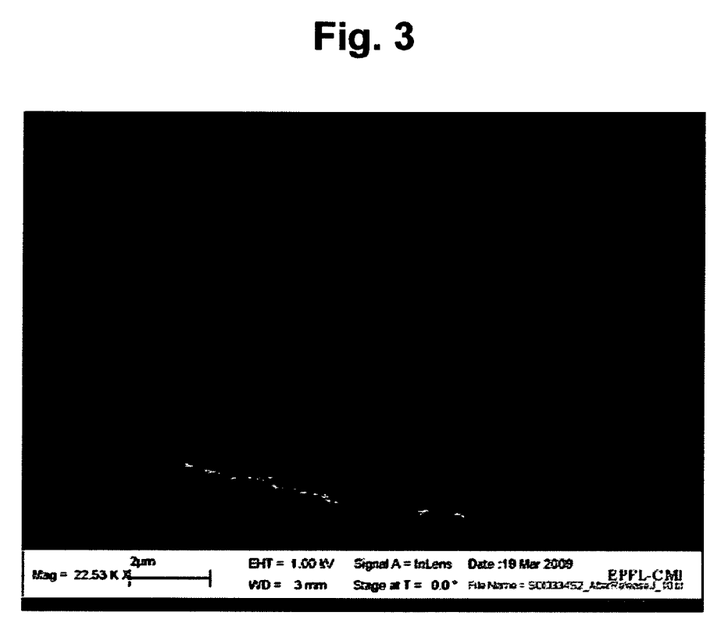
FIG. 3 shows a SEM characterization of the microcarrier surface after oxide deposition by evaporation.

FIG. 3 shows a SEM characterization of the microcarrier surface after oxide deposition by evaporation.

Figure 4:
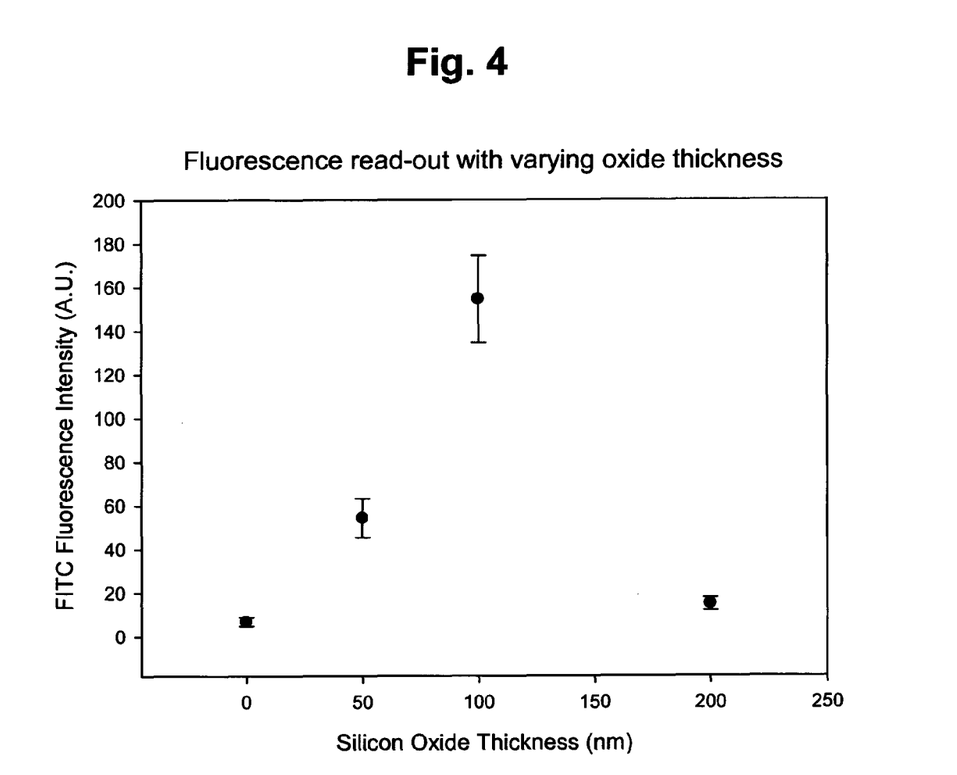
FIG. 4 shows a graphical representation of the fluorescence read-out with varying oxide thickness (Fluorescence intensity read-out minus the background fluorescence).

FIG. 4 shows a graphical representation of the fluorescence read-out with varying oxide thickness (Fluorescence intensity read-out minus the background fluorescence).

Figure 5:
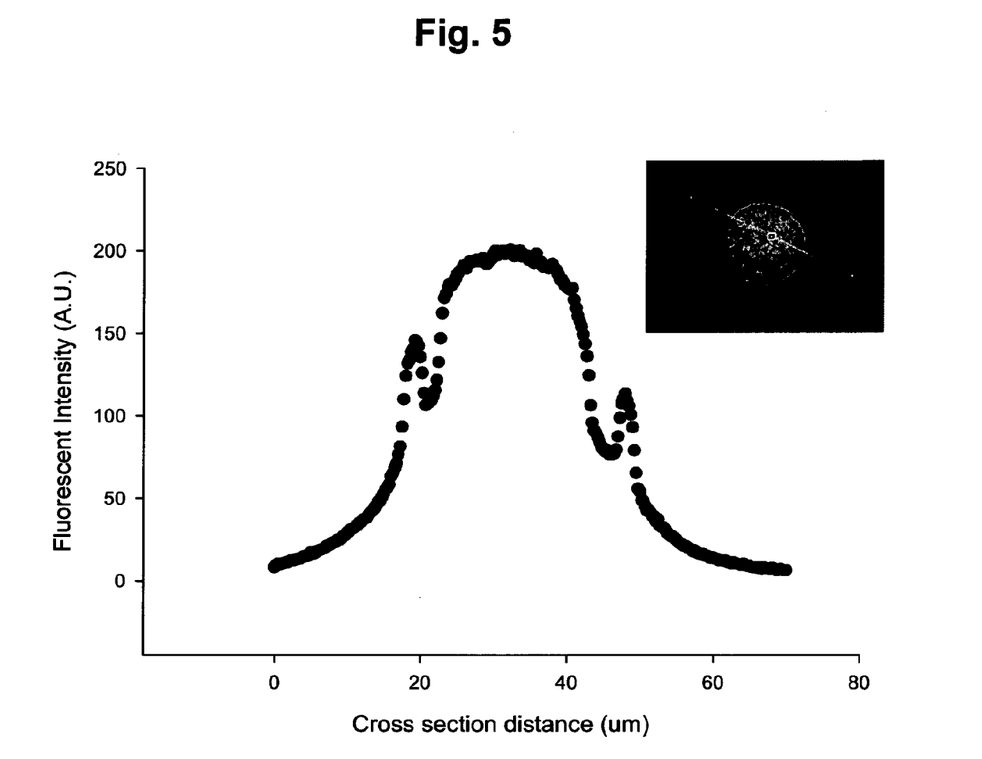
FIG. 5 shows a Fluorescence analysis across the surface of FITC labelled silicon microparticle.

FIG. 5 shows a Fluorescence analysis across the surface of FITC labelled silicon microparticle. In this embodiment, the microcarriers are encoded and the code (holes) can be clearly distinguished from the graph.

Figure 6:
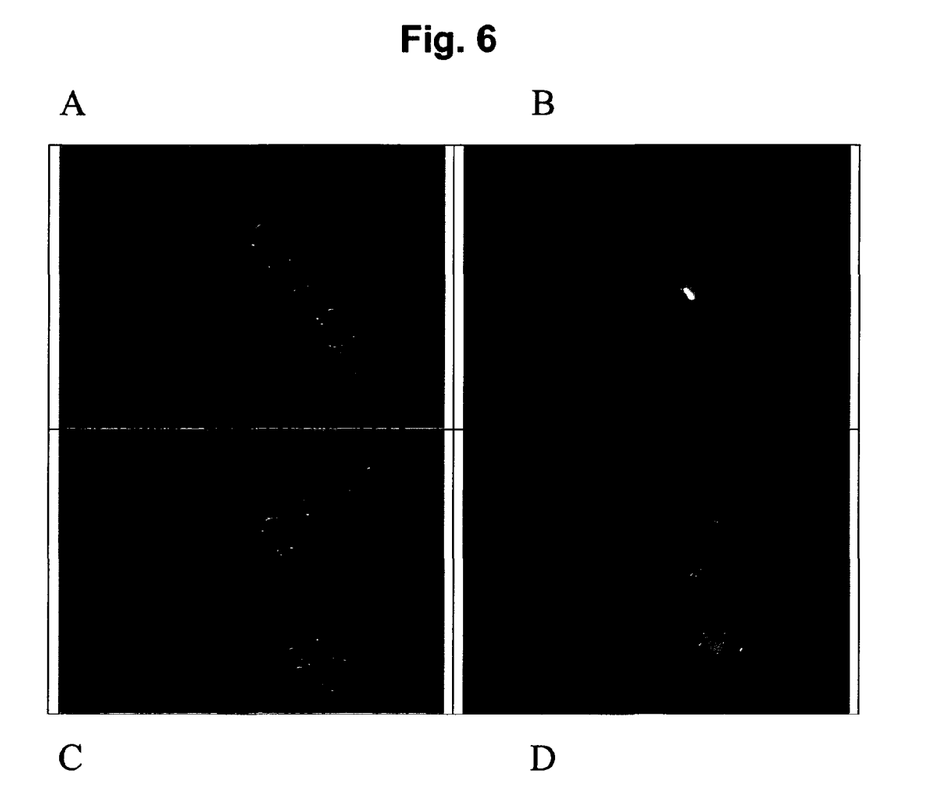
FIG. 6 shows microscopy images of biofunctionalized microparticles that are encoded in this embodiment with DNA probes that have been reacted with complementary DNA targets in an hybridization assay.

FIG. 6 shows microscopy images of biofunctionalized microparticles (that are encoded in this embodiment) with DNA probes that have been reacted with complementary DNA targets in an hybridization assay. The two left images (A, C) are taken under bright light and show all the microparticles. The two right images (B, D) are taken under fluorescent light and reveal the microparticles that have reacted with the fluorescent targets.

Figure 7:
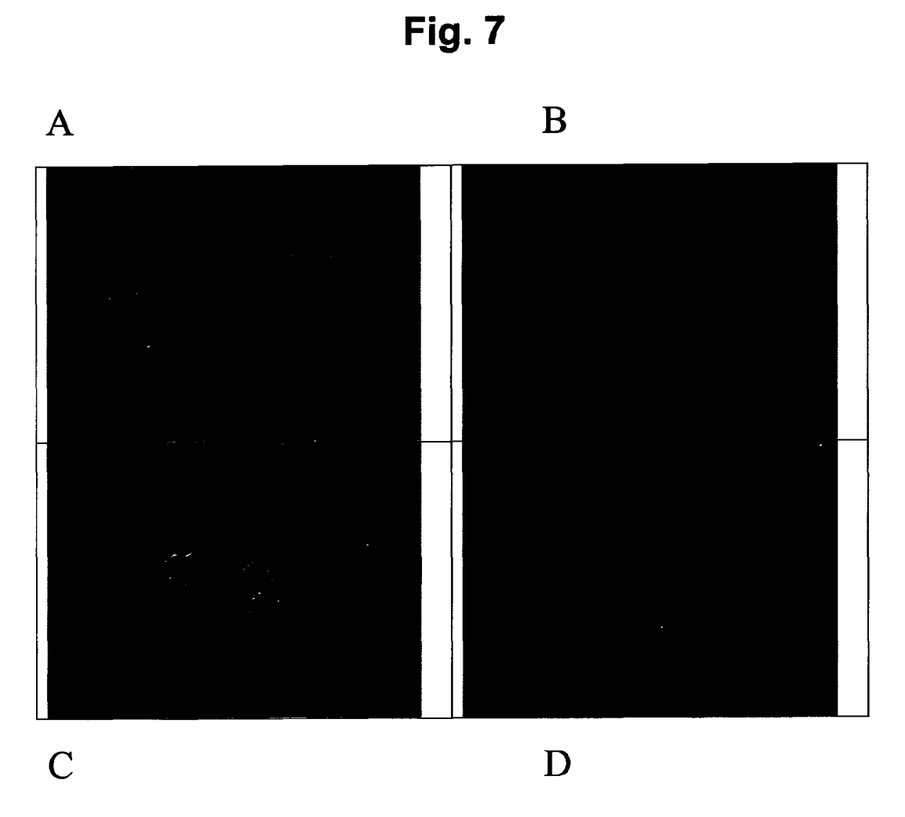
FIG. 7 shows microscopy images of biofunctionalized microparticles (without oxide layer) with DNA probes that have been reacted with complementary DNA targets in an hybridization assay.

FIG. 7 shows microscopy images of biofunctionalized microparticles (without oxide layer) with DNA probes that have been reacted with complementary DNA targets in an hybridization assay. The two left images (A, C) are taken under bright light and show all the microparticles. The two right images (B, D) are taken under fluorescent. No fluorescent signal can be observed due to the destructive light interference effect on the silicon surface.

Figure 8:
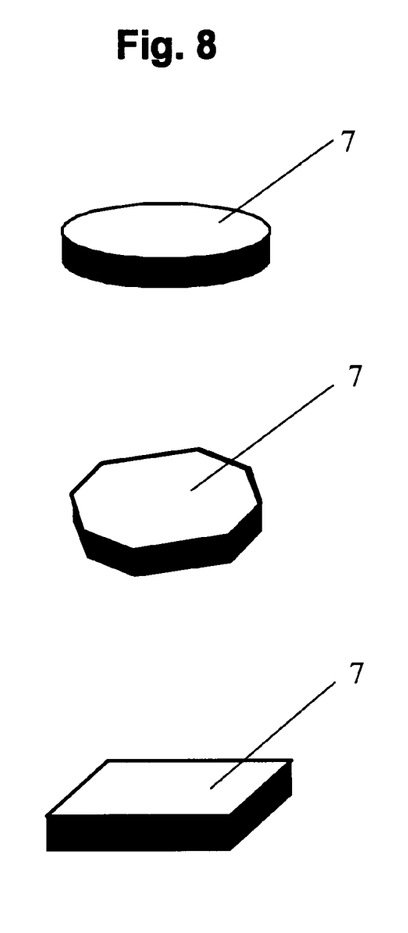
FIG. 8 illustrates various examples of microparticles with the form of a wafer.

FIG. 8 illustrates various examples of microparticles with the form of a wafer. The front face 7 has the form of a disk (top), of a quadrate (bottom) or an octagon (middle).

Figure 9:
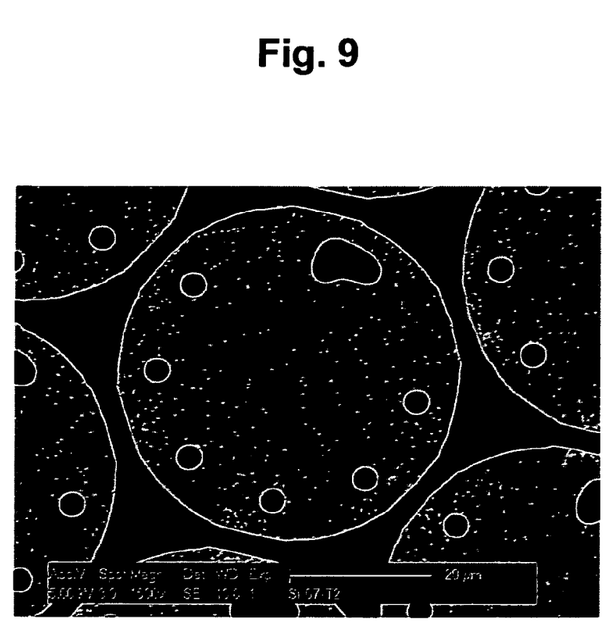
FIG. 9 shows a SEM image of microparticle coated with a thin and inhomogeneous silica layer from sol-gel process.

FIG. 9 shows a SEM image of microparticle coated with a thin and inhomogeneous silica layer from sol-gel process. The image shows a speckled surface of the coating.

Figure 10:
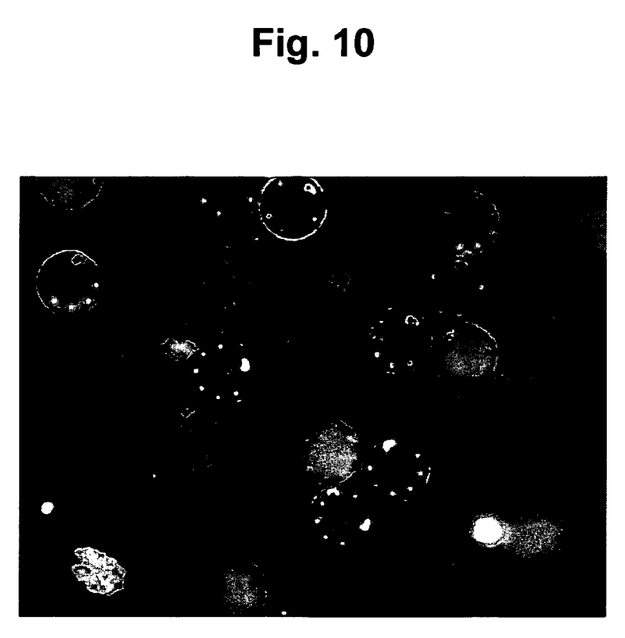
FIG. 10 shows a fluorescent image of microparticles coated with silica layer using layer-by-layer sol-gel process and functionalized with Cy5 labeled DNA sequences.

FIG. 10 shows a fluorescent image of microparticles coated with silica layer using layer-by-layer sol-gel process and functionalized with Cy5 labeled DNA sequences. The fluorescent signals show large variability in intensities and surface homogeneities within and across microparticles.

Within the scope of the present invention, the following definitions apply:

'Functionalized' or 'biofunctionalized' refers to a carrier or microcarrier having one or more, but preferably one, type of ligand attached to its surface, which may serve as capturing or receptor molecule for a given target molecule (analyte). The term 'molecule' is to be understood broadly and may well include several molecules, particles or cells. For example, the target 'molecule' may be a virus particle and/or the capturing 'molecule' (ligand) may be a group of antigen-binding fragments. In another example, the target 'molecule' may be a nucleic acid such as a, DNA, a RNA or ssDNA fragment and the capturing 'molecule' another nucleic acid such as a DNA, RNA or ssDNA fragment that is designed to hybridize with the former. It may also be that for specifically capturing one target molecule different capturing molecules are necessary. Within the scope of the present invention, the mentioned examples will qualify as a 'capturing molecule' or 'target molecule', respectively. Ligands and target molecules may be natural, synthetic or semi-synthetic.

The term 'function' refers to the ability to bind and/or react with a given target molecule and does hence refer to the presence of a specific ligand.

The terms 'ligand', 'capturing molecule' and 'receptor molecule' are used herein synonymously. The same applies to the terms 'target molecule' and 'analyte'.

'Microparticles' refer to any type of particles microscopic in size, typically with the largest dimension being from 100 nm to 300 micrometers, preferably from 1 µm to 200 µm. The microparticles may be of any shapes and sizes. Preferably, the microparticles have the form of a wafer which means that their height is notably smaller (e.g. by at least a factor of two) than both their width and their length and that they have two essentially parallel and essentially flat surfaces at the top and at the bottom.

'Microcarriers' as used herein are microparticles which are functionalized in order to analyze and/or to react with an analyte in a sample. The term "functionalized microcarrier" is used simultaneously herein.

A "wafer-like shape" or a "form of a wafer" refers here to a particular shape of a microparticle where the height is notably smaller (e.g. by at least a factor of two) than both the width and the length and that microparticle has two essentially parallel and essentially flat surfaces (front faces) at the top and at the bottom (see FIG. 8). A "disk-like" shape refers to a shape in the form of a wafer with a circular front face.

In a first aspect, the invention provides a method for producing microcarriers suitable for fluorescent assays, comprising the steps of: (a) Providing a wafer having a sandwich structure comprising a bottom layer, an insulator layer and a top layer; (b) Etching the top layer to delineate microparticles; (c) Etching away the insulator layer, thereby pre-releasing the microparticles from the wafer; (d) Depositing a thin film layer on the wafer still holding the microparticles; and (e) Lifting-off the microparticles from the wafer.

In a preferred embodiment, the bottom and the top layer of the wafer are made of or comprise monocristalline silicone. Preferably, the wafer is a silicon-on-insulator (SOI) wafer. SOI wafers are commercially available (example of supplier: ICEMOS TECHNOLOGY LTD, 5 Hannahstown Hill. Belfast). They consists of a sandwich structure of three layers; the thick bottom layer 3 made of monocristalline silicon, the buried layer (or insulator layer) 2 made of oxide called BOX (Buried OXide layer), and a top layer 1 called device layer made of monocristalline silicon. The top layer 1 is chemically identical to the bottom layer 3 except that it is much thinner, typically 1 to 10 micrometers. The typical thickness of the buried layer 2 ranges from 10 µm to 1 µm. The typical thickness of device layer 1 ranges from 100 µm to 500 µm. The resolution of this thickness is typically of the order of 100 µm.

Step (b) may be done by a variety of methods; preferred is photolithography. In a preferred embodiment of the described method, step (b) is done by (i) Coating a photosensitive resist layer onto the top layer of the wafer; (ii) Delineating microparticles on the photosensitive layer using photolithography techniques; (iii) Etching the top layer to delineate microparticles; and (iv) Removing the photosensitive layer.

The photosensitive resist may be positive or negative photoresist. One example for a positive resist is MICROPOSIT S 1805 PHOTO RESIST supplied by Shipley Company and one example for a negative photoresist is GM1040 SU-8 PHOTO EPOXY as supplied by Gersteltec Engineering Solutions.

The photosensitive resist layer 4 may be applied onto the wafer by different techniques known in the art, such as spray coating, or preferably spin coating.

Typically, in order to delinate the surface layout 7 of the microparticles, the photosensitive resist 4 is illuminated with UV light through a mask, such as a chrome/glass mask. Open patterns in the mask corresponding to microparticles layout provide a space-selective UV illumination. Photo initiators react and start polymerizing the resist where the photosensitive resist has been space-selectively illuminated. Specific chemistry is then used to remove unexposed and unreacted resist. The remaining the pattern of hardened resist defines the outer shape of the microparticles.

In a preferred embodiment herein, the remaining the pattern of hardened photoresist 4 further defines a code. Said code is preferably in a binary code consisting of the presence of not of hole-like structures 5, more preferably all-through holes, in the microparticle.

Subsequently, the top layer is etched, see step (iii). This may e.g. be done by deep reactive silicon etching (DRIE), such as the Bosch process (J. K. Bhardwaj, H. Ashraf, Proc. SPIE, 2639, 224 (1995); A. Schilp, M. Hausner, M. Puech, N. Launay, H. Karagoezoglu, F. Laermer, Advanced etch tool for high etch rate deep reactive ion etching in silicon micromachining production environment, Proceeding MST 2001, Dusseldorf) for deep silicon etching based on DRIE (Deep Reactive Ion Etching; Madou M J, 2002, Fundamentals of microfabrication, CRC Press).

Then follows the "pre-release" of the microparticles from the wafer: In step (c) of the method described herein, the insulator layer 2 is etched away. This is achieved by any suitable chemical or chemico-physical etching method where the material to be etched away is immersed in a liquid phase of etchant or in a gas phase of etchant respectively. Preferred is the use of hydrofluoric acid vapor phase etcher (HF VPE). HF evaporates at room temperature and the etching process starts spontaneously. The etch rate is preferably controlled by the wafer temperature that can be adjusted from 35° C. to 60° C. It remains a layer consisting of the material of the top layer 1 that is patterned according to the design given by the mask.

The insulator layer 2 is used as a sacrificial layer and its removal is meant to release or lift off the microparticles from the substrate wafer. However, unlike initially expected, the microparticles do not fly off but rather remain attracted to the substrate wafer, i.e. to the remaining bottom layer 3. All microparticles stay at essentially the same positions as they were before the insulator layer etching. Without being bound to theory, this unexpected behavior is due to the very small size, volume, and weight of the microparticles. The forces that keep the particles attached are probably due to intermolecular and electrostatic interactions and are not yet fully characterized. They allow the manipulation of the wafer even in an upside-down position, which is key for some upcoming processing steps and allows for a wide range of cleanroom processes such as deposition of metals, alloys, and oxides for modifying mechanical, optical, thermal, or magnetic properties of the microparticles, even if they require the wafer to be held upside-down.

The completion of the release step can e.g. be verified under phase contrast microscopy or DIC (differential interference contrast) microscopy by observing a random distribution of colors on the microparticles, which indicate different tilt angles after completed HF vapour release.

As the microparticles are still bound to the wafer, an additional thin film layer 6 can then be deposited on the microparticles in step (d). The addition of this thin film layer can be done by using a variety of cleanroom processes so long as they do not require an acceleration of the wafer or application of forces on the surface such as it would detach the microparticles. Preferably, processes involving vibrating or spinning the wafer, such as spray-coating or spin-coating or exerting mechanical forces on bound microparticles such as lamination are to be avoided. Thus, in a preferred embodiment, thin film deposition of various materials in gas phase such as PECVD, evaporation, or sputtering are used.

The thin film layer 6 of step (d) is preferably essentially transparent and is preferably of dielectric material, more preferably an oxide or a nitride, and even more preferably silicon dioxide. However, the method disclosed herein is also suitable for the deposition of a suitable polymer, such as parylen or a metal (aluminium, chromium, gold, silver and the like).

For optical modification, the thickness of the layer 6 is of main importance because it will define the light interference scheme later on during the surface fluorescence readout. The typical thickness is approx. 110 nm when working with red fluorescence labels. For getting a transparent layer, any dielectric material, such as nitride, may be used. However, the optimal dielectric thickness would be different because it has to be adjusted for the reflective index of the propagation medium.

The deposition of the thin film layer 6 in step (d) may be done by a number of known methods, such as by Plasma-enhanced chemical vapor deposition (PECVD), by evaporation or by sputtering (see Madou M J, 2002, Fundamentals of microfabrication, CRC Press). Typical equipments are Oxford Plasmalab System 100, Leybold Optics LAB 600H, and Pfeiffer SPIDER 600 respectively. The thickness of materials deposited during thin-film deposition process such as PECVD is controlled by the reaction time. Preferably, processes that require an important acceleration of the wafer such as using vibrations and/or shaking and/or rotation are avoided as the pre-released microparticles may be detached by the resulting mechanical force.

Therefore, deposition methods based on spin-coating should be avoided.

When using a silicon substrate wafer, the deposition temperature is preferably kept as low as possible to prevent the pre-released silicon microparticles to weld together with the silicon substrate wafer. Typical temperatures are in the range of room temperature (RT) to 300° C.

In one embodiment, silicon dioxide is deposited by the PECVD technique. For this purpose, a mixture of gases such as dichlorosilane or silane and oxygen are used, typically at pressures from a few hundred milliTorr to a few Torr.

In step (e), the microparticles are finally lifted off (i.e. actually released) from the substrate 3. This may e.g. be done by dipping the wafer into a liquid solution such as acetone under mechanical agitation, such as sonication in water sonication bath or by vibration. The sonication-based method instantaneously removes the microparticles from the substrate wafer and transferred to the liquid solution.

The microparticles and/or microcarriers obtained by said method have preferably a substantially flat shape, i.e. are typically plane. The layout or surface 7 is typically defined by the mask used in the photolithographic process, see above. Exemplary surface layouts are a disk, a quadrate or an octagon, see FIG. 8. Most preferable a disk-like shape. Preferably, their diameter ranges between 1-300 µm.

In a preferred embodiment, the microcarrier is encoded, more preferably a digital code, even more preferably an engraved digital code. Such an engraved digital code may e.g. consist of the presence or not of one or more hole-like structures 5 which preferably traverse the entire thickness of the particle (also termed "all-through holes"). Thus, a set of holes 5 at specific location on a specific microparticle can be interpreted as a binary number which is the code of that microparticle. The code can be read by simple optics under white light illumination during the decoding step. When used in multiplexed bioassay for instance, the code of a microparticle is indicative of the unique type of probes that are attached to the surface of the microparticle.

In another aspect, the invention provides a silicon microparticle and/or a silicon microcarrier obtainable by the method disclosed herein.

In still another aspect, the invention provides a silicon microparticle and/or a silicon microcarrier having a wafer-like shape and being coated by a layer of a dielectric material on one surface and on its circumference.

The microcarriers provided herein may be used in biological assays. For this purpose, the microparticles, after being microfabricated in clean room, are biofunctionalized with one or more capturing probes such as antibodies or ssDNA sequences and may then be used in biological samples to capture corresponding biomarkers. In fluorescent assays, the assay is designed in such a way that the capture of biomarkers is revealed through a fluorescence signal that arises on the surfaces of the microparticles and which can be detected by fluorescence readout. This is done by using methods known in the art that typically involve the use of fluorescent labels attached to complementary molecules or directly to the analytes. The microparticles and/or microcarriers are particularly useful in multiplexing assays, e.g. to obtain the biomarkers profile of a patient. For said purpose, microcarriers with different codes are ideally used.

In one embodiment, the microfabrication process flow contains 6 main steps described as follows and with reference to FIG. 1:

1. An initial SOI wafer (typical but not limited to dimensions of 4 inch in diameter, 380 µm thick substrate wafer 3, 1 µm thick of BOX 2, 10 µm of device layer 1) is provided.
2. Spin coating of positive photosensitive resist 4 onto the SOI wafer. Illumination of the photosensitive resist 4 with UV light through a chrome/glass mask. Open patterns in the chrome layer corresponding to microparticles layout provide a space-selective UV illumination. Photo initiators react and start polymerizing the resist where the photosensitive resist has been space-selectively illuminated. Specific chemistry is then used to remove unexposed and unreacted photoresist 4. The remaining pattern of hardened photoresist 4 defines the outer shape 7 of the microparticles and, in this particular embodiment, also the digital code. It serves as mask for the next step of silicon etching, i.e. it prevents the area covered with resist to be etched away.

3. The top silicon layer 1 without protective resist 4 is completely etched away all through the layer using e.g. a well known Bosch process. The etching stops only when the BOX layer 2 is reached. The resist 4 is then removed in a wet chemical bath. It remains a clean monocristalline silicon layer 1 that is patterned according to the design of the microparticles.

4. This step is the "pre-release" process. The BOX layer 2 is completely etched away e.g. by a hydrofluoric acid vapor phase etcher (HF VPE). The HF evaporates at room temperature and the etching process starts spontaneously. The etch rate is controlled by the wafer temperature that can be adjusted from 35° C. to 60° C. The BOX layer 2 is used as a sacrificial layer and its removal is meant to release or lift off the microparticles from the substrate wafer. The completion of the HF vapour release can be verified under phase contrast microscopy or DIC (differential interference contrast) microscopy by observing a random distribution of colors on the microparticles, which indicate different tilt angles after completed HF vapour release.

5. Taking advantage of the fact that the microparticles are still bound to the wafer, an additional oxide layer 6 such as silicon dioxide is then deposited on the microparticles. Different types of oxide deposition methods can be used such as PECVD, evaporation, or sputtering. The deposition temperature should be kept as low as possible to prevent the pre-released silicon microparticles to weld together with the silicon substrate wafer. Typical temperatures are in the range of room temperature (RT) to 300° C. For the deposition of silicon dioxide from PECVD technique, a mixture of gases such as dichlorosilane or silane and oxygen are used, typically at pressures from a few hundred milliTorr to a few Torr.

6. The microparticles are finally lifted off (i.e. actually released) from the substrate by dipping the wafer into a liquid solution such as acetone under gentle sonication in water sonication bath. The sonication-based method instantaneously removes the microparticles from the substrate wafer and transferred to the liquid solution. The microparticles are kept in suspension in liquid containers or vessels and let settled down for subsequent recovery. The microparticles kept in acetone for instance re-disperse very well under mechanical agitation such as short sonication pulse.

Exemplification

Materials

The starting material of the methods described herein is a SOI (silicon-on-insulator) wafer that is commercially available (supplier: ICEMOS TECHNOLOGY LTD, 5 Hannahstown Hill. Belfast). The diameter of SOI wafer used in the microfabrication process flow described herein is 4 inches. Dimensions: 4 inch in diameter, 380 µm thick substrate wafer, 1 µm thick of BOX, 10 µm of device layer. If not otherwise indicated, the microparticles were prepared according to the procedure outlined for FIG. 1.

The microparticles used in the following examples comprise an engraved digital code by means of the presence or not of all through holes at specific locations, thereby constituting a binary code.

EXAMPLE 1

Bosch Process (See e.g. http://en.wikipedia.org/wiki/Deep_reactive-ion_etching as Accessed on Oct. 9, 2009)

The Bosch process, also known as pulsed or time-multiplexed etching, alternates repeatedly between two modes to achieve nearly vertical structures.

A standard, nearly isotropic plasma etch. The plasma contains some ions, which attack the wafer from a nearly vertical direction. (For silicon, this often uses sulfur hexafluoride [SF6].)

Deposition of a chemically inert passivation layer. (For instance, C4F8 source gas yields a substance similar to Teflon.)

Each phase lasts for several seconds. The passivation layer protects the entire substrate from further chemical attack and prevents further etching. However, during the etching phase, the directional ions that bombard the substrate attack the passivation layer at the bottom of the trench (but not along the sides). They collide with it and sputter it off, exposing the substrate to the chemical etchant.

These etch/deposit steps are repeated many times over resulting in a large number of very small isotropic etch steps taking place only at the bottom of the etched pits. To etch through a 0.5 mm silicon wafer, for example, 100-1000 etch/deposit steps are needed. The two-phase process causes the sidewalls to undulate with an amplitude of about 100-500 nm. The cycle time can be adjusted: short cycles yield smoother walls, and long cycles yield a higher etch rate.

EXAMPLE 2

Oxide Deposition

Two oxide deposition techniques have been tested, PECVD and evaporation. The PECVD technique was performed at 100° C. while the evaporation was done at room temperature. Both techniques required high vacuum environment. Both techniques were characterized with high-magnification SEM (scanning electron microscope) images in terms of cleanliness and homogeneity of the oxide surface. Then they will be evaluated regarding the coupling chemistry, the intensity and the homogeneity of fluorescence they provide.

The thickness can be measured using ellipsometry or reflectometry using equipment such as the spectro-reflectometer NanoSpec 6100 instrument present in many cleanroom facilities (see e.g. http://cmi.epfl.ch/metrology/Nanospec.php as accessed on Oct. 9, 2009) and commercialized by Nanometrics Inc (http://www.nanometrics.com).

FIG. 2 and FIG. 3 show the surfaces of a single microparticle after the deposition of oxide ($SiO_2$) by PECVD and evaporation respectively. The surface obtained by evaporation seems smoother than the one obtained by PECVD, with a more homogeneous oxide deposition. However, the effects of the surface properties such as oxide density and roughness have to be evaluated at a later stage of surface biofunctionalization.

It is very important to highlight that the deposition of oxide on structured and pre-released microparticles (step 5 in FIG. 1) does not prevent the final lift-off (i.e. actual release) into liquid solution under sonication (step 6 in FIG. 1). This last step is absolutely not affected by the oxide deposition and behaves as previously, when no oxide was deposited on the structured microparticles.

EXAMPLE 3

Influence of Oxide Thickness on Fluorescence Readout

According to literature (Bras, M., et al., Optimisation of a silicon/silicon dioxide substrate for a fluorescence DNA microarray. Biosensors & bioelectronics, 2004. 20(4): p. 797-806; Voile, J. N., et al., Enhanced sensitivity detection of protein immobilization by fluorescent interference on oxidized silicon. Biosensors and Bioelectronics, 2003. 19(5): p. 457-464), the fluorescence read-out of biofunctionalized silicon surfaces depends on the oxide layer thickness. To verify this, the biofunctionalization of amino-modified silicon wafers with different oxide layer thickness was tested with a 5T-$NH_2$-DNA-3'FAM probe. A hybridization assay was performed on the Si wafer with oxide layer thickness of 100 nm.

Samples of silicon wafers (and silica beads as a control for the experimental procedure), previously amino-modified were prepared as described below:
  Sample 1: Plain silicon (untreated);
  Sample 2: Oxidized silicon (piranha);
  Sample 3: HF-etched silicon (0 nm);
  Sample 4: 50 nm;
  Sample 5: 100 nm; and
  Sample 6: 200 nm.

All samples were washed 4 times (1 mL) in borate buffer (pH 8.2, 10 nM of borate and 150 nM of sodium chloride in pure water). To all samples (supernatant removed) 400 µL of a 10% solution of glutaraldehyde in borate buffer were added, and samples were agitated at RT for 1 h. After which the silicon fragments and silica beads were washed 4 times (1 mL) in borate buffer and supernatant removed. Before removing the supernatant of the silica beads suspension, 200 µL were aliquoted for a Schiff test (Eine neue Reihe organischer Diamine. H. Schiff Justus Liebigs Ann Chemie 140, 92-137 1866) which resulted positive, as beads turned purple revealing the presence of aldehyde groups.

Subsequently, 400 µL borate buffer and 10 µL (1 nmol) of 5' NH2-DNA-3' FAM were added to all supports, and samples were agitated at RT for 2 h. After which, the silicon fragments and silica beads were washed 4 times (1 mL), resuspended in borate buffer (1 mL) and analyzed by microscopy.

Images:

TABLE 1

Sample fluorescence readout; mean value in arbitrary unit and standard deviation values obtained on acquired images.

| Sample | Fluorescence readout mean value [A.U.] | Fluorescent readout std deviation |
| --- | --- | --- |
| 0 nm | 12.779 | 2.043 |
| 50 nm | 60.336 | 8.947 |
| 100 nm | 160.439 | 19.971 |
| 200 nm | 20.856 | 2.982 |
| Plain Si | 11.941 | 1.822 |
| Oxidized silicon (Piranha) | 16.964 | 2.803 |

Sample $SiO_2$ 100 nm was further incubated with 10 µL of Cy5 labeled DNA target (Match to the immobilised FAM labelled probe) in 400 µL of SSPE (5×) buffer, to verify if fluorescence would be observed under Cy5 filter. The same was done for sample Plain Si, for control. The samples were incubated at RT for 5 minutes with agitation, after which they were washed with SSPE buffer (1 mL) 3 times and analysed under Cy5 filter.

Results:

The fluorescence results suggest the immobilization of the DNA probe was successful and the highest intensity was observed for sample $SiO_2$ 100 nm, as expected from literature. The Cy5 fluorescence observed after incubation of this sample with Cy5 match target suggest hybridization took place. There is no non-specific binding of the Cy5-DNA onto plain Si, as derived from the lack of fluorescence observed.

EXAMPLE 4

Surface Fluorescence Readout on Sinele Microparticles

The biofunctionalization of microparticles with fluorescent probes allows for optically characterizing the homogeneity of the probe attachment across the surface of a single particle. FIG. 5 shows such an optical characterization. This simple method stands as a quality control at the single-particle level.

This simple optical characterization technique has great advantages at the single-particle level over the traditional colorimetric tests (e.g. Kaiser Test, see E. Kaiser, R. L. Colescott, C. D. Bossinger, P. I. Cook, Analytical Biochemistry 34 595 (1970)) or spectrometric measurements (e.g. FTIR). First the relative amount of desired functional groups on a single microparticle can be quantified in terms of fluorescence units, whereas traditional methods can only provide information on the total amount of functional groups in bulk. Since only the desired groups on the surface can react with the fluorescence dye, it is less likely to generate false positive results like in the other methods (e.g. due to residue starting materials in the reaction vessel). By analyzing the fluorescent intensity across the surface of one labelled microparticle (FIG. 5), it was found that the fluorescence is fairly homogenous at the central region.

EXAMPLE 5

Fluorescent Hybridization Assay

The use of suitable microparticle for surface fluorescence readout is demonstrated in a hybridization assay where a certain type of probes P1 is attached to microparticles of a specific digital code. The biofunctionalized microparticles are incubated within a microtube with the targets T1 complementary to P1 that have a fluorescent labels. The microparticles are washed after incubation and an aliquot of the suspension is spread over a microscope slide. The fluorescence readout is done on a fluorescence inverted microscope. The orientation of the microparticles on the microscope slide is not controlled by this method which means that some microparticles will be correctly oriented for surface fluorescence readout (the oxide layer being on the side of observation) while some others will be wrongly oriented (the oxide layer being on the opposite side of observation).

FIG. 6 shows microparticles under bright light imaging (left column) and same microparticles under fluorescence imaging (right column). The right images reveal fluorescence signals on the surface of the microparticles that have reacted with the fluorescent targets and that are in the correct orientation.

This experiment demonstrates the use of silicon microparticles in multiplexed biological assays such as immunoassays or hybridization assays.

EXAMPLE 6

Surface Fluorescence Readout on Single Microparticles Without Oxide

This section demonstrates the necessity of the additional oxide layer in order to enable the fluorescence readout on silicon surfaces. The same experiment as described in the example 5 is repeated on microparticles similar to the previous ones except that they don't have the additional oxide layer. The same experiment protocol is repeated on those microparticles. The left images in FIG. 7 show the microparticle under bright light imaging and the right images show the same microparticles under fluorescent imaging.

No fluorescence signal is observable because of the lack of oxide layer on the surface of the microparticles. This negative control proves the need of an additional oxide layer for surface fluorescence readout on silicon microparticles.

EXAMPLE 7

Layer-by-Layer Sol-Gel Deposition of Oxide Layer Around Microparticles

A classical sol-gel treatment was conducted on silicon microparticles in suspension in reaction chamber. 8 mL EtOH, 2 mL water, 10 μL TEOS ([TEOS]=1 g/L), and 500 μL, $NH_4OH$ 25% is added to the chamber. The reaction is performed during 1 hour, and washed several times with EtOH solution. A clear decrease of the surface contact angle after the sol-gel deposition indicates an important formation of silicon oxide at the surface of the solid supports. The formation of oxide has also been revealed by XPS measurement where a peak corresponding to $SiO_2$ appears clearly after the sol-gel process.

Characterization of the silica layer after sol-gel deposition using SEM revealed inhomogeneous and thin layer with estimated thickness values below 30 nm. These obtained surface properties do not allow for a strong and homogeneous fluorescent signal on microparticle surface.

Alternately and to increase the SiO2 thickness above 30 nm, a sequential approach has been tried, which alternates sol-gel reactions and functionalization of the surface with amino groups (APTES). The objective is to create alternatively negative (sol-gel treatment) and positive (APTES treatment) charges, to enhance the affinity of TEOS with the surface. The method has been tested repeating multiple times the following protocol:

1. Put microparticles in reaction tube. Add 0.8 mL EtOH, 0.2 mL water, 5 μL, TEOS ([TEOS]=5 g/L), and 50 μL $NH_4OH$ 25%. Let the reaction during 10 minutes. Then wash several times the tube with EtOH.
2. Add 1 mL acetone and 100 μL APTES. Let the reaction during 10 minutes. Then wash several times with acetone.

The characterization of the silica layer obtained with the sequential approach has revealed layer thickness up to 80 nm. With 5 treatments applied successively the SiO2 thickness was around 87 nm but still show poor homogeneity of the surface (see FIG. 9). The thickness values obtained with the layer-by-layer sol-gel process are closer to required values of 100 nm for best efficiency in fluorescent signal readout.

EXAMPLE 8

Surface Fluorescence Readout on Single Microparticles with Oxide Deposited by Layer-By-Layer Sol-Sel Process Microparticles coated with silica in sol-gel process have been further derivatized and functionalized with fluorescently-labeled DNA sequences (Cy5) in order to assess the fluorescence readout on their surface. The microparticles have been observed under a fluorescence microscope through a thin plastic film (approx 150 μm).

Previous tests have shown that without any $SiO_2$ coating, the signal was very weak and undetectable from conventional fluorescence microscope. It has also been shown that with only one sol-gel treatment, the signal was too small due to the low thickness of the coating (<30 nm). But layer-by-layer sol-gel treatments (thickness around 80 nm) provided measurable signal intensity (see FIG. 10). However the fluorescent signal on the surface of microparticles is highly inhomogeneous within and across microparticles.

While there are shown and described presently preferred embodiments and examples of the invention, it is to be distinctly understood that the invention is not limited thereto but may be otherwise variously embodied and practiced within the scope of the following claims.

What is claimed is:

1. A method for producing microparticles suitable as support for fluorescent assays, comprising the steps of:
   (a) providing a wafer having a sandwich structure comprising a bottom layer, an insulator layer lying over the bottom layer and a top layer lying over the insulator layer;
   (b) etching the top layer to delineate microparticles which are thereby formed on the insulator layer;
   (c) etching away the insulator layer to remove all of the insulator layer;
   (d) depositing a layer on the wafer that is holding the microparticles, whereby mechanical forces that are capable of detaching the microparticles from the wafer are avoided; and
   (e) lifting-off the microparticles from the wafer, wherein step (d) occurs after step (c) and before step (e).
2. The method of claim 1, wherein the wafer is a SOI wafer.
3. The method of claim 1, wherein the deposition of the dielectric material in step (d) includes plasma-enhanced chemical vapor deposition, by evaporation or by sputtering.
4. The method of claim 1, wherein step (e) is performed by sonication.
5. The method of claim 1, further comprising the step of attaching a ligand to the microparticle.
6. The method of claim 1, wherein the layer of step (d) includes a dielectric material.
7. The method of claim 6, wherein the dielectric material is an oxide or a nitride.
8. The method of claim 6, wherein the dielectric material is silicon dioxide.
9. The method according to claim 1, wherein the layer of step (d) includes a polymer or a metal.
10. The method of claim 9, wherein the polymer is parylen.
11. The method of claim 9, wherein the metal is selected from the group consisting of the following: aluminium, chromium, gold and silver.

12. The method of claim 1, wherein step (b) includes the steps of:
  (i) spin coating a photosensitive resist layer onto the wafer;
  (ii) delineating the surface layout of the microparticles on the photosensitive layer using photolithography techniques; and
  (iii) etching the top layer.

13. The method of claim 12, wherein step (iii) includes deep silicon etching.

14. The method of claim 12, wherein step (iii) includes use of the Bosch process.

15. The method of claim 12, wherein the photosensitive resist layer is negative or positive photoresist.

* * * * *